(12) United States Patent
Shyr

(10) Patent No.: US 6,530,629 B2
(45) Date of Patent: Mar. 11, 2003

(54) RETAINER FOR RETAINING INTERFACE ISOLATING PIECES

(75) Inventor: Daniel Shyr, Taipei (TW)

(73) Assignee: Avance Technologies Inc., Taipei (TW)

( * ) Notice: Subject to any disclaimer, the term of this patent is extended or adjusted under 35 U.S.C. 154(b) by 0 days.

(21) Appl. No.: 10/054,465

(22) Filed: Jan. 24, 2002

(65) Prior Publication Data

US 2003/0001467 A1 Jan. 2, 2003

(30) Foreign Application Priority Data

Jun. 29, 2001 (TW) ..................................... 90210883 U

(51) Int. Cl.[7] ........................... A47B 97/00; F16B 45/02
(52) U.S. Cl. ..................... 312/223.2; 411/400; 411/508
(58) Field of Search ........................... 312/223.1, 223.2, 312/265.6; 211/26, 41.47; 292/197; 411/400, 508, 913; 361/683, 726, 801, 825

(56) References Cited

U.S. PATENT DOCUMENTS

| | | | | |
|---|---|---|---|---|
| 1,071,999 A | * | 9/1913 | Gilson | 292/228 |
| 1,446,364 A | * | 2/1923 | Wheeler | 292/206 X |
| 3,220,078 A | * | 11/1965 | Preziosi | 411/508 X |
| 3,803,670 A | * | 4/1974 | Johnson | 411/508 |
| 4,289,059 A | * | 9/1981 | Alderton | 411/400 X |
| 5,587,877 A | * | 12/1996 | Ryan et al. | 312/223.2 X |
| 5,938,303 A | * | 8/1999 | Ho | 312/223.2 |
| 5,947,571 A | * | 9/1999 | Ho | 312/223.2 X |
| 6,231,139 B1 | * | 5/2001 | Chen | 312/223.2 |

FOREIGN PATENT DOCUMENTS

GB 493587 * 10/1938 ................. 411/400

* cited by examiner

Primary Examiner—James O. Hansen

(57) ABSTRACT

A retainer for retaining interface card isolating pieces is disclosed. Especially, a retainer may retain a plurality of interface card isolating piece at one time. A press strip is installed on a positioning platform of a wire outlet of a computer casing. The press strip exactly presses interface isolating piece on the positioning platform. Two cam buttons are installed on the surface of the casing above the press strip. The cam buttons can be rotated and embedded into the cambered grooves at the top of the press strip so as to provide a pressure to the press strip. Therefore, by the press strip, all the interface cards can be fixed at one time. It is unnecessary to detach screws one by one. All the interface cards can be mounted or detached by fixing the press strip easily.

6 Claims, 6 Drawing Sheets

RETAINER FOR RETAINING INTERFACE ISOLATING PIECES

FIELD OF THE INVENTION

The present invention relates to a retainer for retaining interface card isolating pieces, and especially to a retainer which retains a plurality of interface card isolating piece at one time.

BACKGROUND OF THE INVENTION

A computer interface card is locked to a wire outlet of a computer casing by a metal isolating piece. Referring to FIG. 1, the isolating piece A1 of an interface card A has an inverse L shape. A top thereof is formed above a platform B of the wire outlet, and then is locked by screws. This fixing way is a standard form and has been used for a long time. However, in this way, each interface card is locked by one action. Therefore, the operation is too complex in assembly. In general, as an interface card is added, a screw is necessary to fix it. When the motherboard or a casing is necessary to be updated, all the screws must be detached one by one. It is time-consumed and thus cost in assembly is increased.

SUMMARY OF THE INVENTION

Accordingly, the primary object of the present invention is to provide a retainer for retaining interface card isolating pieces. Especially, a retainer may retain a plurality of interface card isolating piece at one time. A press strip is installed on a positioning platform of a wire outlet of a computer casing. The press strip exactly presses interface isolating piece on the positioning platform. Two cam buttons are installed on the surface of the casing above the press strip. The cam buttons can be rotated and embedded into the cambered grooves at the top of the press strip so as to provide a pressure to the press strip. Therefore, by the press strip, all the interface cards can be fixed at one time. It is unnecessary to detach screws one by one. All the interface cards can be mounted or detached by fixing the press strip easily.

The various objects and advantages of the present invention will be more readily understood from the following detailed description when read in conjunction with the appended drawing.

DETAILED DESCRIPTION OF THE PREFERRED EMBODIMENTS

Figure 1:
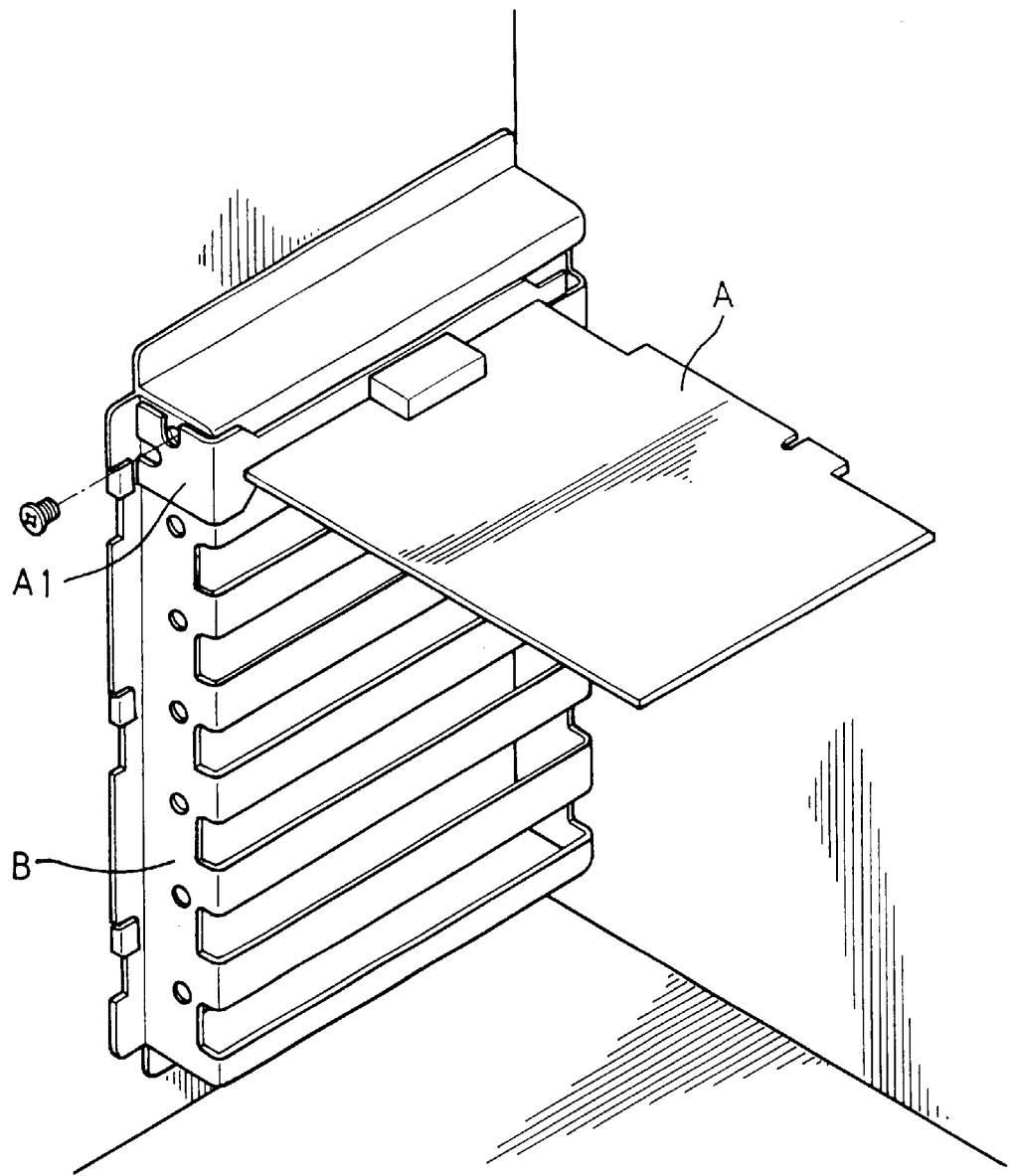
FIG. 1 is a structural schematic view of a prior interface card retainer.
Figure 2:
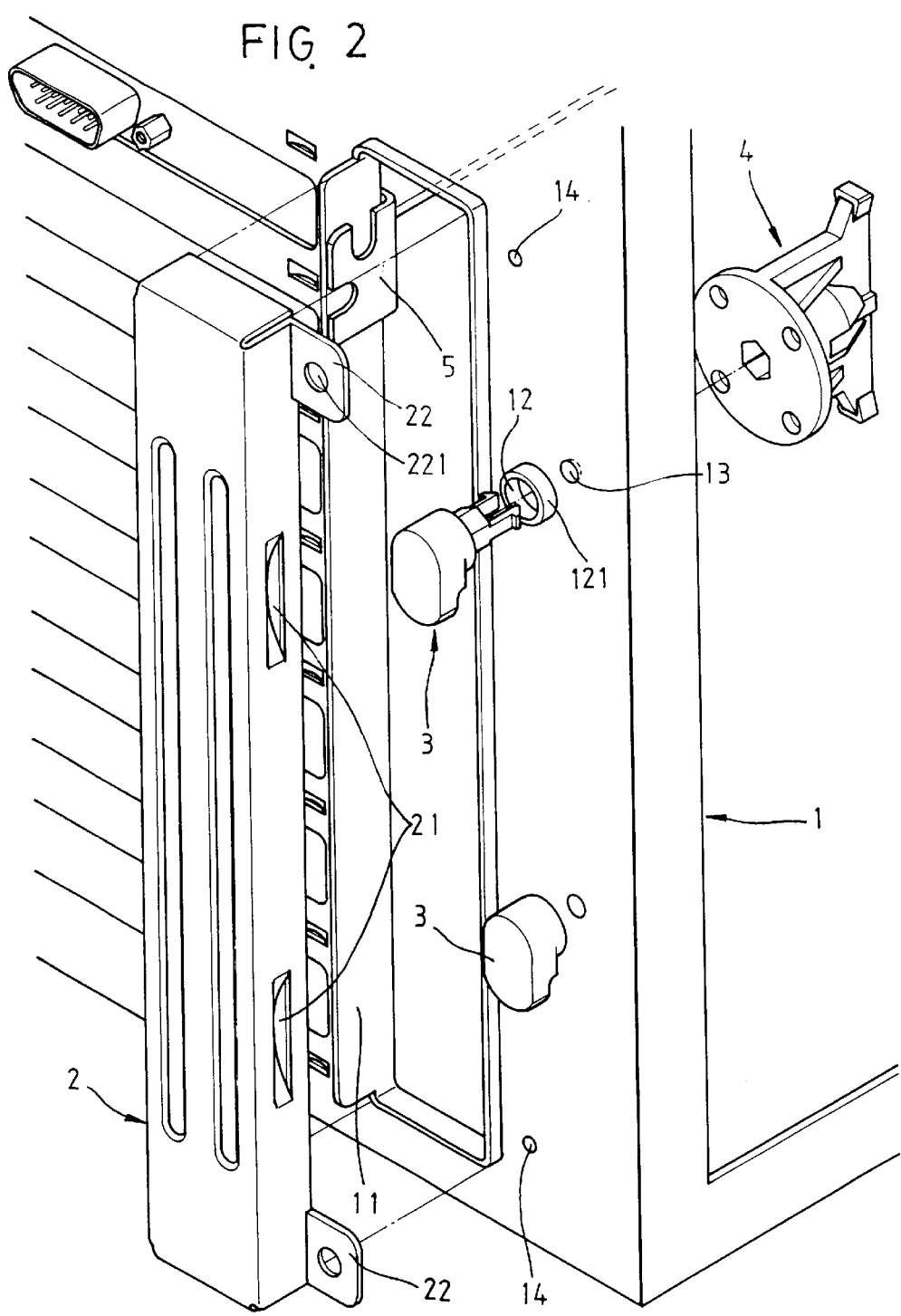
FIG. 2 is an exploded perspective view of the present invention.
Figure 3:
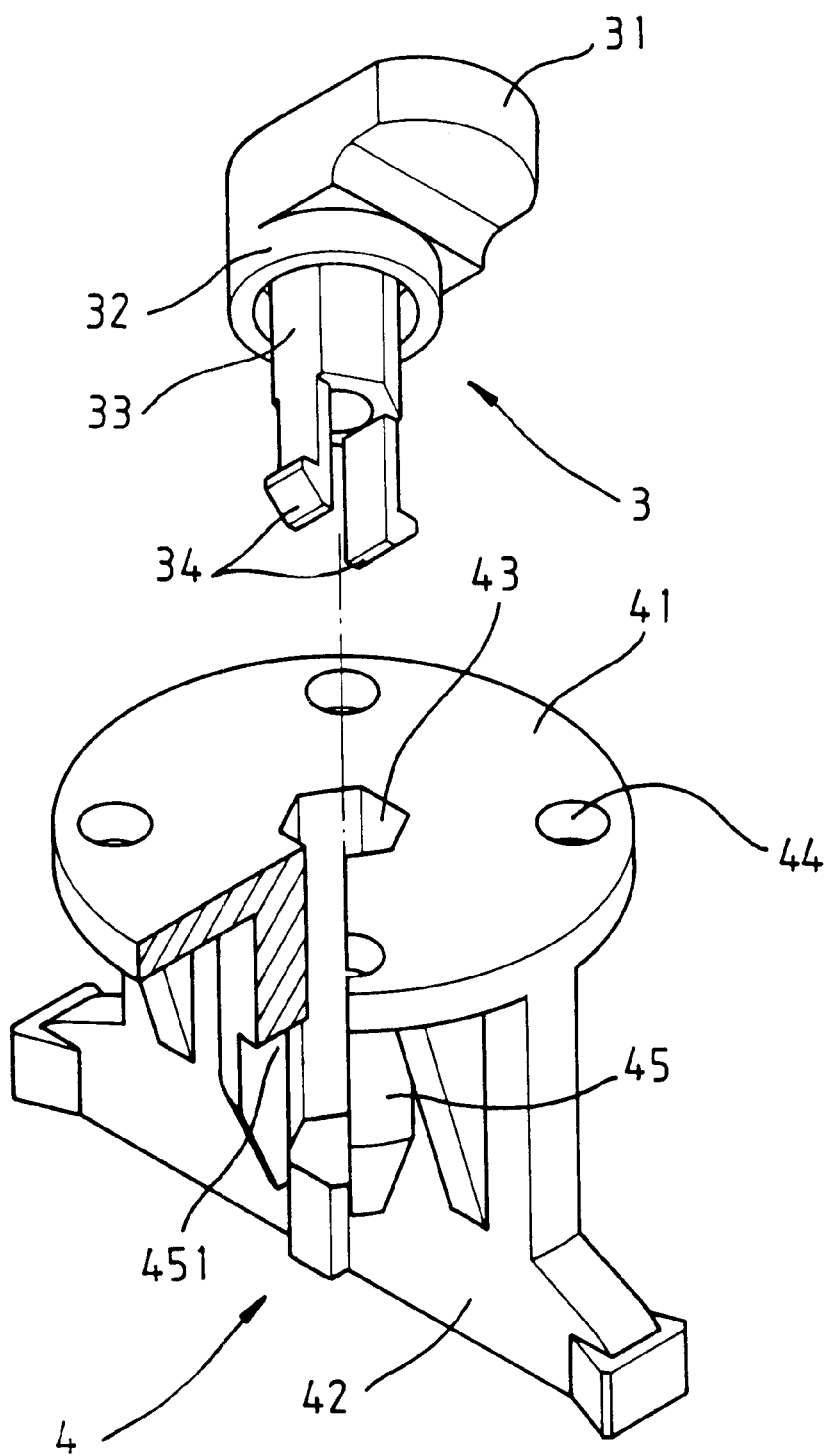
FIG. 3 shows the structure of the cam button and the female seat of the present invention.
Figure 4:
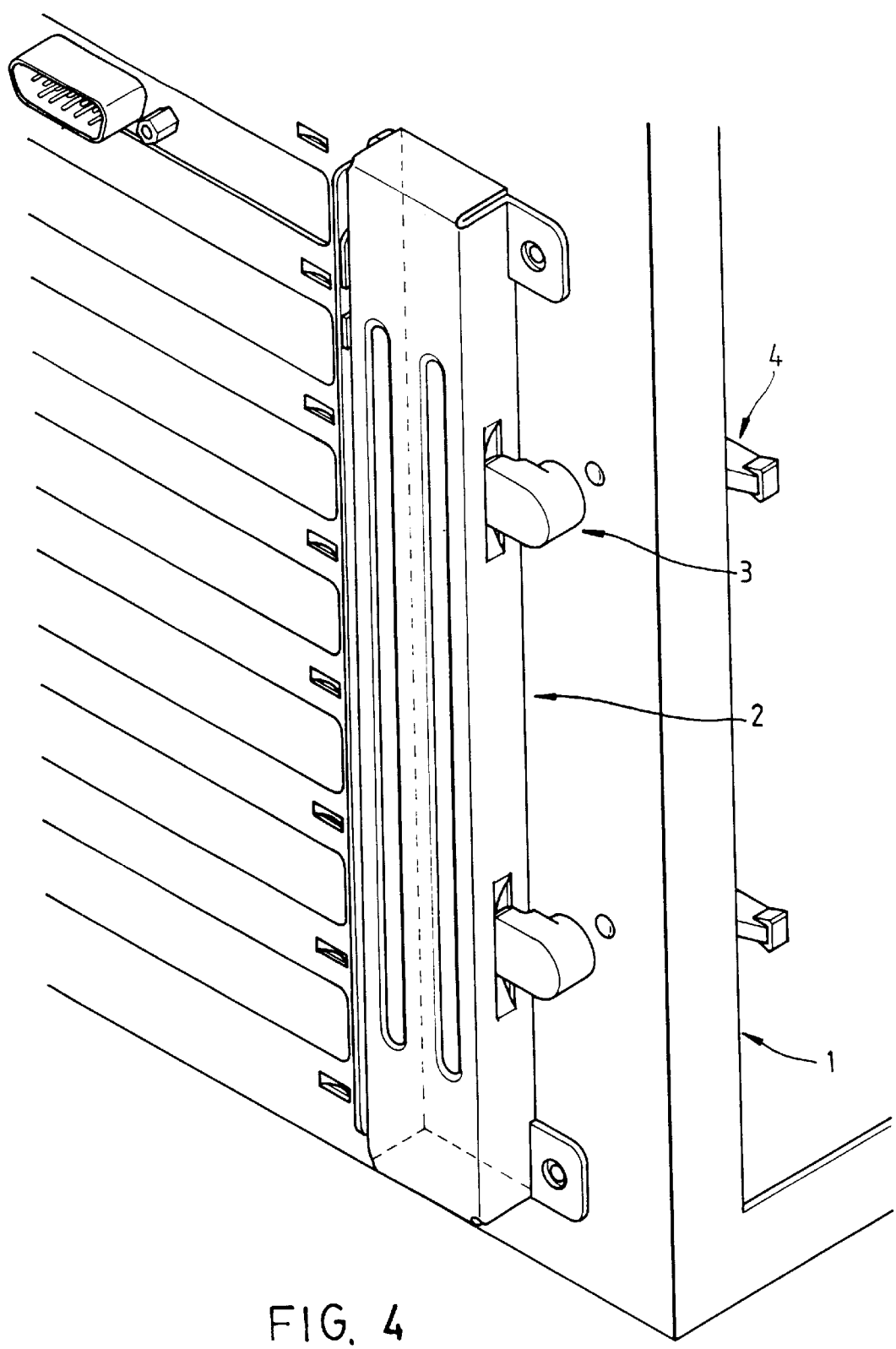
FIG. 4 is an assembly view of the present invention.

Referring to FIG. 2, an exploded perspective view of the present invention is illustrated. In the present invention, a press strip 2 is installed on the positioning platform 11 of the wire outlet of a computer casing 1. The press strip 2 has a rectangular shape having a width approximately equal to that of the positioning platform 11 so as to exactly press an interface isolating piece 5 on the positioning platform 1. A top surface of the press strip 2 is formed with two symmetrical cambered grooves 21. Two ends at the top surface of the press strip 2 are extended with retaining plates 22. Each plate 22 is installed with a round fixing hole 221. The surface of the casing above the press strip 2 is formed with round positioning holes 12 at a position respective to the cambered grooves 21. The edge of each positioning hole 12 is extended with an annular edges 121. The annular edge 121 is exactly engaged with a cam button 3 so that the pivot shaft of the cam button 3 may pass through the hole to be engaged to a female seat 4. A projection 13 is formed on the plate aside the positioning hole 12. Referring to FIG. 3, a partial cross section view of the cam button 3 and a female seat 4 is illustrated. It is shown that a ring 32 protrudes from the axial portion of the cam 3 of the cam button 3. The inner diameter of the ring 32 is exactly equal to the outer diameter of the annular edge 12. Thereby, the ring 32 is exactly pivotally engaged to the annular edge 121. A center of the ring 32 is protruded with a hexagonal cylinder 33. A pair of arrow-like hooks 34 are extended from two opposite sides of the hexagonal cylinder 33. The bodies of the hooks are at the same plane of the hexagonal cylinder 33. The female seat 4 is mainly formed by a round disk 41, a shaft 45 and a rod portion 42. The shaft 45 is connected to the round disk 41 and the rod 42 and at a center therebetween. The center of the round disk 41 has a hexagonal hole 43 which extends to the shaft 45. The peripheral edge of the round disk 41 is formed with concave holes 44 positioned with respect to the projections 13 of the casing. One end of the shaft 45 near the rod portion 42 is formed with two notches 451 at positions with respect to the hooks 34. When the cam button 3 is inserted into the hexagonal hole 43 by the hexagonal cylinder 33 thereof. The hooks 34 are ejected out from the notches 451 so as to position the cam button 3. Therefore, the cam button 3 and the female seat 4 are formed as an integral body. Now, the cam button 3 and the female seat 4 are at two sides of the surface of the casing. Then, by moving the rod portion 42 of the female rod 4, the cam button 3 will rotate synchronously. FIG. 4 shows an assembly view of the present invention.

Figure 5:
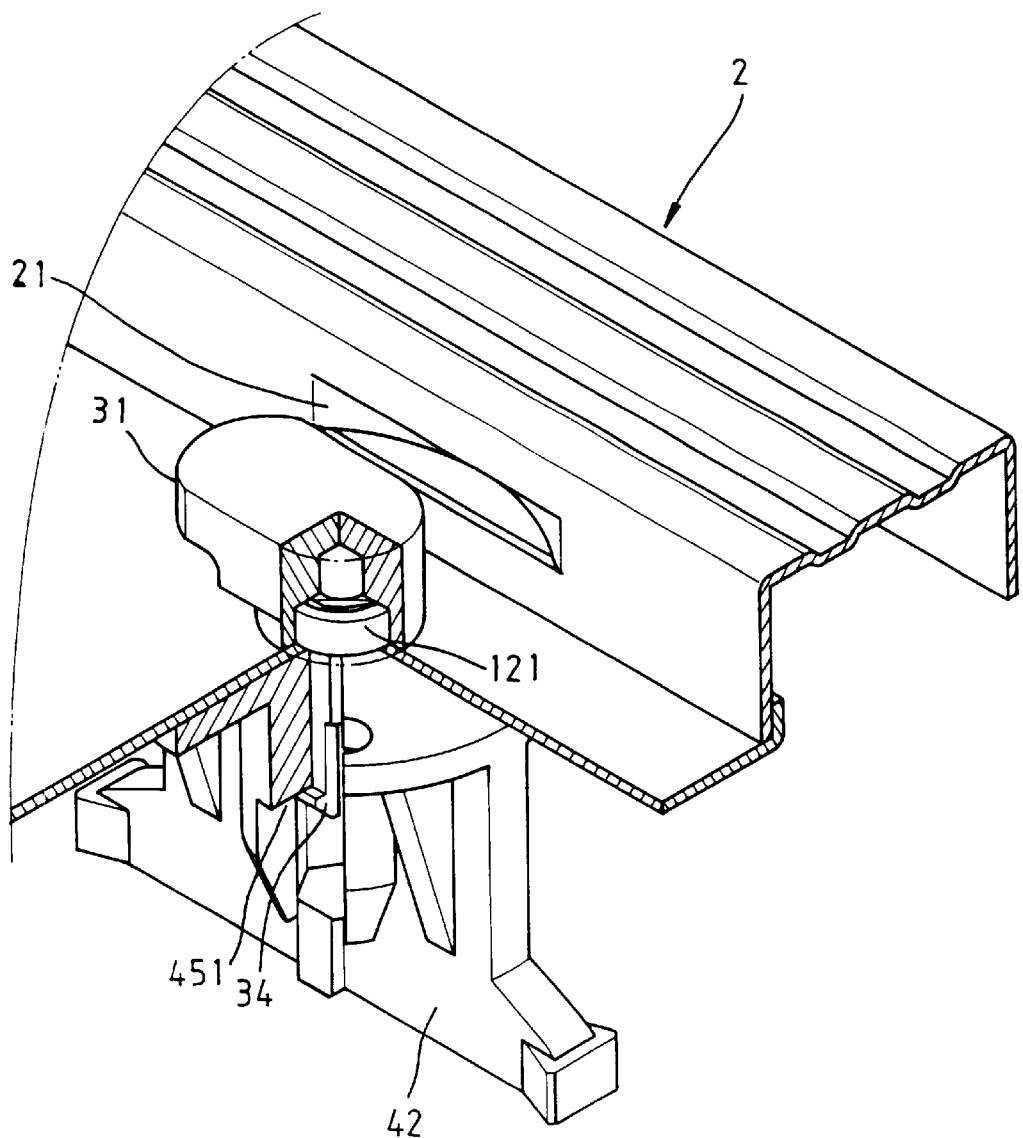
FIG. 5 is a first schematic view showing the operation of the present invention.
Figure 6:
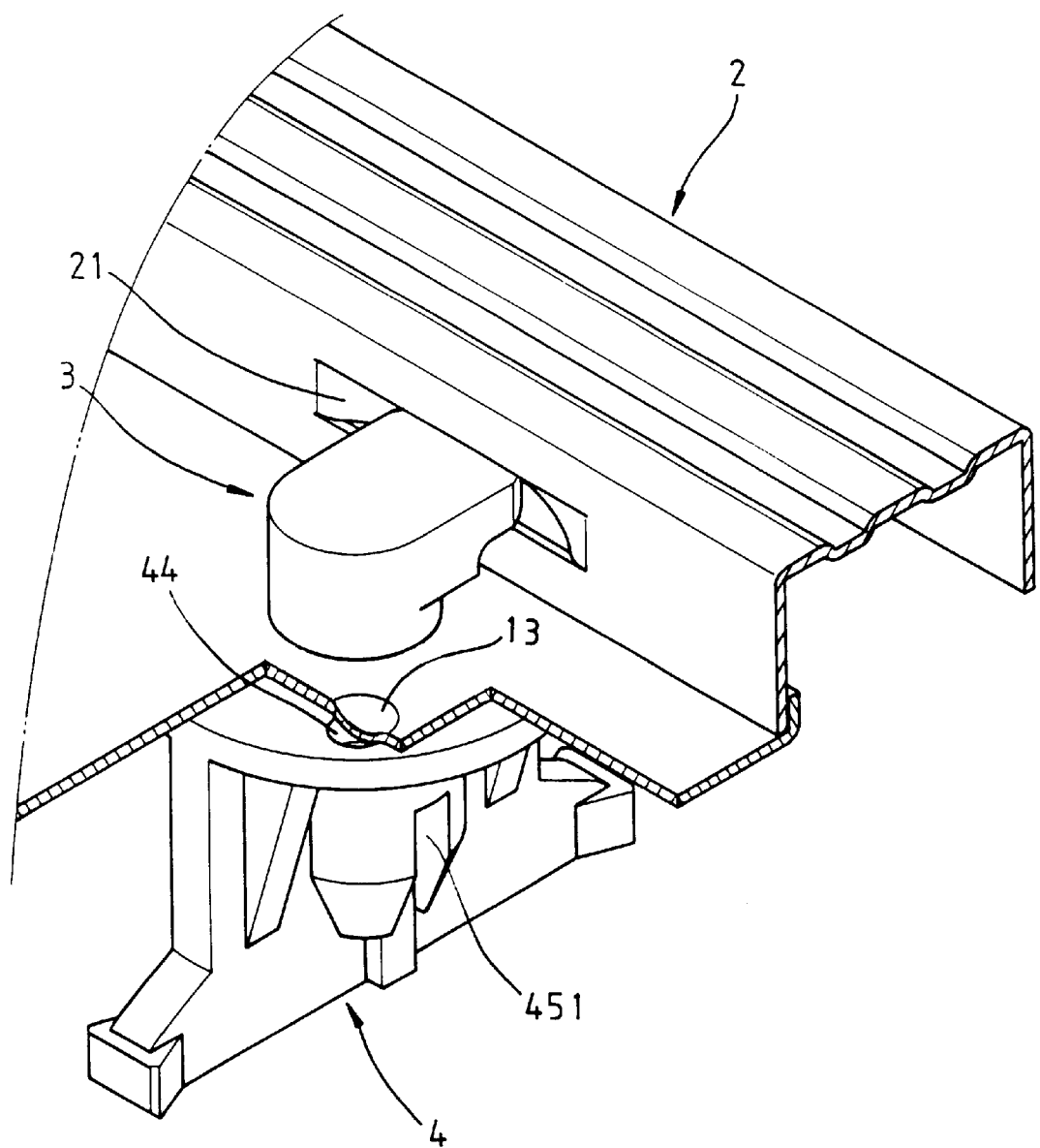
FIG. 6 is a second schematic view showing the operation of the present invention.

Referring to FIG. 5, a schematic view showing the operation of the present invention is illustrated. It is shown that the round disk 41 of the female seat 4 is tightly adhered to an inner side of the surface of the casing. The disk 41 and the cam button 3 clamp the surface. At this time, the cam button 3 is exactly above the cambered groove 21 and the cam 31 is rotated to a horizontal direction. Then, the press strip 2 will release from the cam 31. Thus, the press strip 2 can be taken down for installing an interface card. When the rod portion 42 of the female seat 4 is rotated so that the cam 31 moves downwards (referring to FIG. 6), since the width of the cam 31 of the cam button 3 is slightly smaller than that of the cambered groove 21 of the press strip 2, the cam 31 can be embedded into the cambered groove 21 and presses the cambered edge of the cambered groove 21 so as to form a downward pressure. Since the concave holes 44 of the female seat 4 are engaged with the projections 13 on the surface of the casing, the cam 31 will not slide out of the cambered groove 21. The four holes 44 may provide a 90 degree positioning for the rotation of the female seat 4 and the cam button 3. Furthermore, to enhance the pressure of the press strip 2, screw holes 14 can be formed on the surface of the casing at a position corresponding to the fixing holes 221 of the press strip 2. Thereby, screws may pass through the screw holes for fixing the two components.

Therefore, in the present invention, by the press strip 2, all the interface cards can be fixed at one time. It is unnecessary to detach screws one by one. All the interface cards can be mounted or detached by fixing the press strip easily.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A retainer for retaining interface card isolating pieces, wherein a press strip is installed on a positioning platform of a wire outlet of a computer casing; the press strip exactly presses interface isolating piece on the positioning platform; a top surface of the press strip is formed with at least one cambered groove;

a surface of the casing above the press strip is formed with round positioning holes at a position corresponding to the cambered grooves;

each round positioning hole exactly receives a cam button so that a pivot shaft of the cam button passes through the positioning hole to be engaged to a female seat; a center of a cam of the cam button is protruded with a polygonal cylinder which serves as a center shaft; a pair of arrow-like hooks are extended from two opposite sides of the polygonal cylinder;

the female seat is mainly formed by a round disk, a shaft and a rod portion; the shaft connects to the round disk and the rod portion and located at a center therebetween; a center of the round disk has a polygonal hole which is corresponding to the polygonal post and extends to the shaft; one end of the shaft near the rod portion is formed with two notches at positions with respect to the hooks; when the cam button is inserted into the polygonal hole by the polygonal cylinder thereof; the hooks are ejected out from the notches so to position the cam button; therefore, the cam button and the female seat are formed as an integral body; then, by moving the rod portion of the female rod, the cam button will rotate synchronously;

thereby, the round disk of the female seat and the cam button are tightly adhered to an inner side of the surface of the casing; the cam button is exactly above the cambered groove;

when the cam is rotated to release from the cambered groove; the press strip will release from the cam; thus, the press strip is taken down for installing an interface card; when the rod portion of the female seat is rotated so that the cam moves downwards, the cam is embedded into the cambered groove and presses the cambered edge of the cambered groove; thereby, a downward pressure is formed.

2. The retainer for retaining interface card isolating pieces as claim in claim 1, wherein the press strip has a rectangular shape, and the width of the press strip is approximately equal to that of the positioning platform.

3. The retainer for retaining interface card isolating pieces as claim in claim 1, wherein two ends of a top surface of the press strip are extended with retaining plates; each plate is formed with a round fixing hole; screw holes are formed on the surface of the casing at a position corresponding to the fixing holes of the press strip; thereby, screws pass through the screw holes for fixing the press strip to the plate.

4. The retainer for retaining interface card isolating pieces as claim in claim 1, wherein an edge of each positioning hole is extended with an annular edges; a ring protruded from an axial portion of the cam of the cam button; an inner diameter of the ring is exactly equal to an outer diameter annular round edge; thereby, the ring is exactly pivotally engaged to the annular edge.

5. The retainer for retaining interface card isolating pieces as claim in claim 1, wherein the surface of the casing aside each positioning hole is formed with a projection, and an peripheral edge of the round disk is formed with concave holes positioned with respect to the projections of the casing; when the cam is embedded into a cambered groove, the concave holes of the female seat are engaged with the projections; thus, the cam does not slide out of the cambered groove.

6. The retainer for retaining interface card isolating pieces as claim in claim 1, wherein the polygonal cylinders of the cam button are hexagonal cylinders and the polygonal holes of the female seat are hexagonal holes.

* * * * *